United States Patent
Hara et al.

(10) Patent No.: US 9,673,253 B2
(45) Date of Patent: Jun. 6, 2017

(54) METHOD OF MANUFACTURING PHOTOELECTRIC CONVERSION DEVICE

(71) Applicant: CANON KABUSHIKI KAISHA, Tokyo (JP)

(72) Inventors: Koji Hara, Ichikawa (JP); Nobutaka Ukigaya, Yokohama (JP); Takeshi Aoki, Oita (JP); Yukinobu Suzuki, Koza-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/139,569

(22) Filed: Apr. 27, 2016

(65) Prior Publication Data

US 2016/0329374 A1    Nov. 10, 2016

(30) Foreign Application Priority Data

May 7, 2015 (JP) ................................. 2015-095228

(51) Int. Cl.
*H01L 27/00* (2006.01)
*H01L 27/146* (2006.01)

(52) U.S. Cl.
CPC .. *H01L 27/14698* (2013.01); *H01L 27/14636* (2013.01); *H01L 27/14643* (2013.01)

(58) Field of Classification Search
None
See application file for complete search history.

(56) References Cited

U.S. PATENT DOCUMENTS

| 2003/0096438 | A1  | 5/2003  | Lee |
| 2009/0004770 | A1  | 1/2009  | Park |
| 2009/0078974 | A1* | 3/2009  | Nagai ............... H01L 27/14625 257/292 |
| 2014/0299958 | A1* | 10/2014 | Kokumai ........... H01L 27/1463 257/446 |
| 2015/0155173 | A1* | 6/2015  | Hirota .............. H01L 21/02164 438/682 |
| 2015/0214269 | A1* | 7/2015  | Endo ................. H01L 27/14685 257/443 |
| 2015/0303227 | A1* | 10/2015 | Ishino .............. H01L 27/14603 257/432 |

(Continued)

FOREIGN PATENT DOCUMENTS

| JP | 3149169 B2 | 3/2001 |
| JP | 2008-172056 A | 7/2008 |

*Primary Examiner* — Evren Seven
(74) *Attorney, Agent, or Firm* — Fitzpatrick, Cella, Harper & Scinto (57) ABSTRACT

A method of manufacturing a photoelectric conversion device includes forming, with material containing aluminum, an electrically conductive pattern on a semiconductor substrate including a photoelectric converter, forming, on the electrically conductive pattern, an insulating film containing hydrogen, performing first annealing in a hydrogen-containing atmosphere, forming, on the insulating film, a protective film having lower hydrogen permeability than that of the insulating film after the first annealing, and performing second annealing in the hydrogen-containing atmosphere. Temperature in the first annealing is not less than temperature when forming the insulating film and not more than temperature when forming the protective film.

8 Claims, 7 Drawing Sheets

| FIRST ANNEALING | 350°C 30min | 400°C 30min | 425°C 30min | 425°C 120min |
|---|---|---|---|---|
| DARK OUTPUT | O (REDUCED) | O (REDUCED) | X | X |

DEPOSITION TEMPERATURE OF INSULATING FILM = 330°C, DEPOSITION TEMPERATURE OF PROTECTIVE FILM = 410°C

(56) References Cited

U.S. PATENT DOCUMENTS

| | | | |
|---|---|---|---|
| 2015/0311245 A1* | 10/2015 | Yamazaki | H01L 27/14632 257/43 |
| 2016/0005782 A1 | 1/2016 | Aoki | |
| 2016/0043133 A1* | 2/2016 | Maekawa | H01L 27/14627 438/70 |
| 2016/0133713 A1* | 5/2016 | Gutman | H01L 29/42324 257/66 |
| 2016/0315116 A1* | 10/2016 | Tazoe | H01L 27/14698 |

* cited by examiner

| FIRST ANNEALING | N/A | 350°C 30min | 400°C 30min | 425°C 30min | 425°C 120min |
|---|---|---|---|---|---|
| OCCURRENCE OF LOST PART | × (PRESENT) | △ (SOMEWHAT REDUCED) | ○ (REDUCED) | ○ (REDUCED) | ○ (REDUCED) |

DEPOSITION TEMPERATURE OF INSULATING FILM = 330°C, DEPOSITION TEMPERATURE OF PROTECTIVE FILM = 410°C

FIG. 5B

| FIRST ANNEALING | 350°C 30min | 400°C 30min | 425°C 30min | 425°C 120min |
|---|---|---|---|---|
| DARK OUTPUT | ○ (REDUCED) | ○ (REDUCED) | × | × |

DEPOSITION TEMPERATURE OF INSULATING FILM = 330°C, DEPOSITION TEMPERATURE OF PROTECTIVE FILM = 410°C

METHOD OF MANUFACTURING PHOTOELECTRIC CONVERSION DEVICE

BACKGROUND OF THE INVENTION

Field of the Invention

The present invention relates to a method of manufacturing a photoelectric conversion device.

Description of the Related Art

In a semiconductor device manufacturing process, annealing can be performed in a hydrogen-containing atmosphere in order to terminate a dangling bond at the interface between a semiconductor substrate and an insulating film thereon. Japanese Patent No. 3149169 has described a technique of performing annealing at 450° C. in a 3%$H_2$ Ar atmosphere after forming the first protective insulating film (silicon oxide film) on a metal wiring and forming the second protective insulating film (silicon nitride film) on the first protective insulating film at 370° C. Note that Japanese Patent No. 3149169 is not directed to the manufacture of a photoelectric conversion device or a solid-state image sensor.

In a field of a photoelectric conversion device such as a CMOS image sensor or a CCD image sensor, various efforts are being made to reduce a dark output (dark current). The dark output is a signal generated even though the photoelectric conversion device is not exposed to light.

As a method of reducing the dark output, for example, a method of forming a silicon nitride film after forming an electrically conductive pattern, and then performing annealing in a hydrogen-containing atmosphere is considered. When such annealing is performed, however, a lost part (void) may be formed in the electrically conductive pattern in the annealing.

Figure 8:
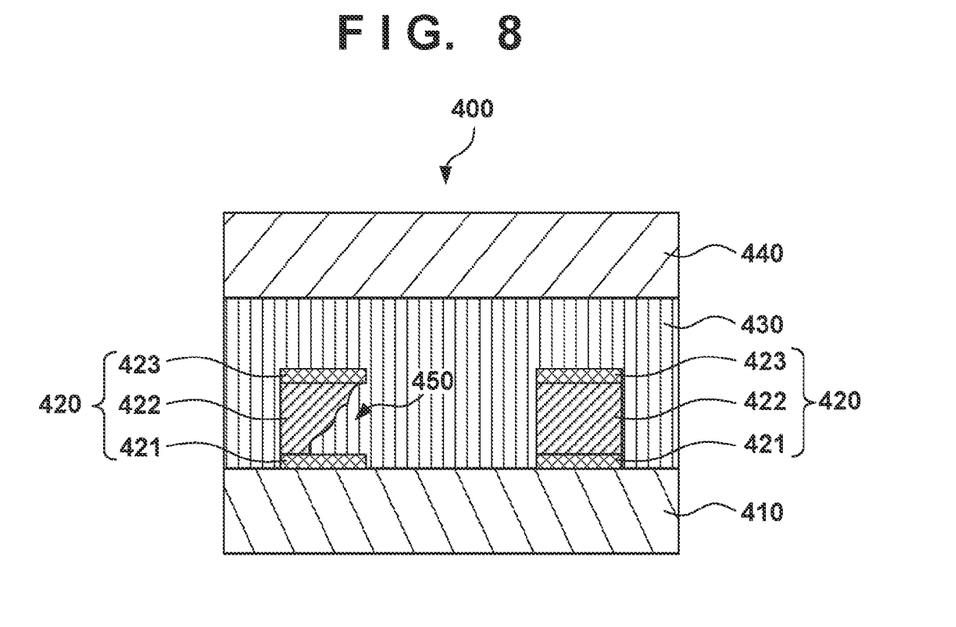
FIG. 8 is a sectional view schematically showing occurrence of a lost part.

Occurrence of a lost part will be described with reference to FIG. 8. Note that FIG. 8 is a view created by the present applicant in order to describe the lost part that may be formed by annealing and does not form the prior art. A wiring structure 400 includes a silicon oxide film 410, an electrically conductive pattern 420 arranged on the silicon oxide film 410, a silicon oxide film 430 arranged so as to cover the electrically conductive pattern 420, and a silicon nitride film 440 arranged on the silicon oxide film 430. The electrically conductive pattern 420 can have a stacked structure of a barrier metal 421, a metal layer 422 containing aluminum, and a barrier metal 423. A lost part 450 can be formed by executing annealing in a hydrogen-containing atmosphere after the silicon nitride film 440 is formed. A cause of this has not been clarified yet. However, movement of aluminum making up the metal layer 422 in a process of reducing the stress of the electrically conductive pattern 420 in annealing is considered as a possibility of that cause.

SUMMARY OF THE INVENTION

The present invention provides a technique advantageous in reducing occurrence of a lost part while reducing a dark output.

One of aspects of the present invention provides a method of manufacturing a photoelectric conversion device, the method comprising: forming, with a material which contains aluminum, an electrically conductive pattern on a semiconductor substrate including a photoelectric converter; forming, on the electrically conductive pattern, an insulating film which contains hydrogen; performing, in a hydrogen-containing atmosphere, first annealing on a structure including the semiconductor substrate, the electrically conductive pattern, and the insulating film; forming, on the insulating film, a protective film having lower hydrogen permeability than that of the insulating film after the first annealing; and performing, in the hydrogen-containing atmosphere, second annealing on a structure including the semiconductor substrate, the electrically conductive pattern, the insulating film, and the protective film after formation of the protective film, wherein a temperature in the first annealing is not less than a temperature when forming the insulating film and not more than a temperature when forming the protective film.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings.

Figure 3:
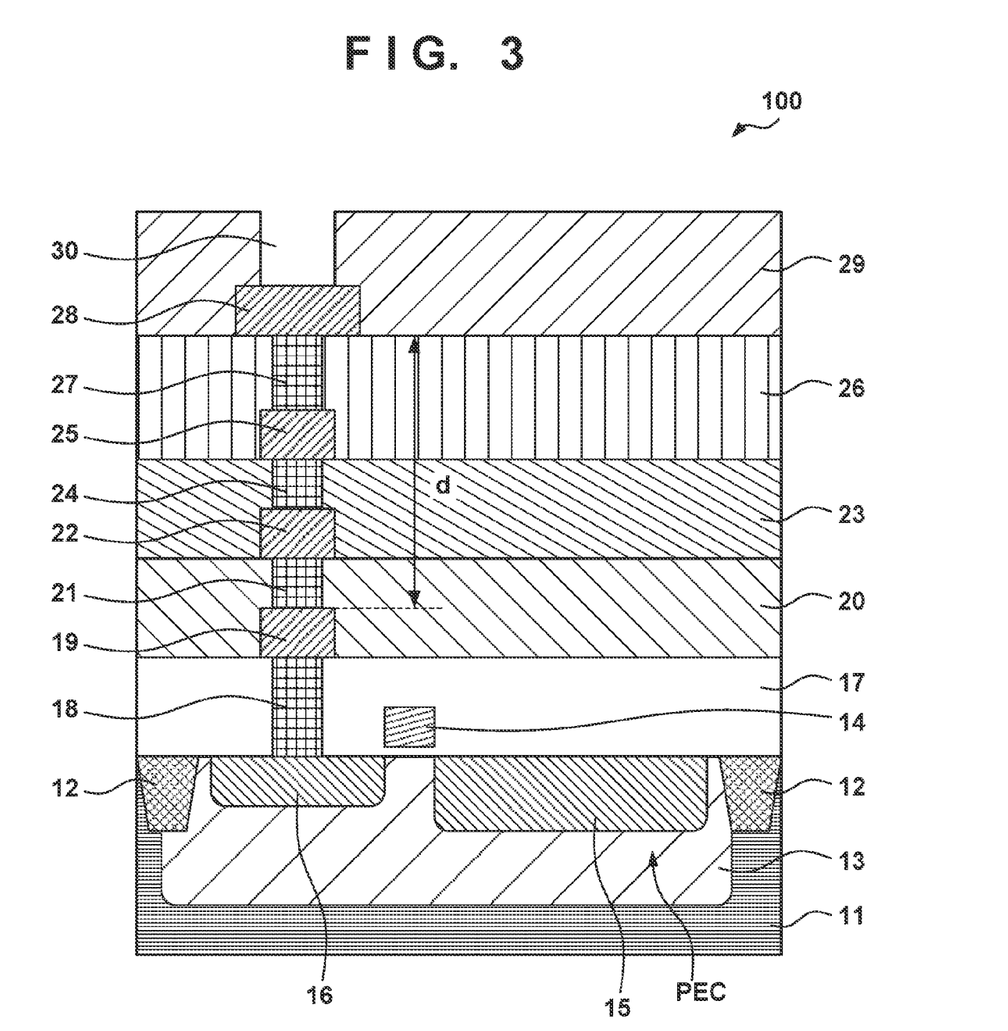
FIG. 3 is a schematic sectional view for explaining the method of manufacturing the photoelectric conversion device according to the first embodiment of the present invention.

FIG. 3 schematically shows the sectional structure of a photoelectric conversion device 100 according to the first embodiment of the present invention. The photoelectric conversion device 100 can be configured as a device including at least one photoelectric converter PEC. The photoelectric conversion device 100 can typically be configured as a solid-state image sensor (image sensor) such as an MOS image sensor or a CCD image sensor, or as a linear sensor.

The photoelectric conversion device 100 includes a semiconductor substrate 11 such as a silicon substrate. In one example, the semiconductor substrate 11 such as the silicon substrate can include, for example, a semiconductor region 13 of the first conductivity type, a semiconductor region 15 of the second conductivity type, a semiconductor region 16 of the second conductivity type, an element isolation region 12, and the source and drain (not shown) of a transistor. Note that the first conductivity type and the second conductivity type are different from each other. The second conductivity type is an n type when the first conductivity type is a p type, and the second conductivity type is the p type when the first conductivity type is the n type.

The semiconductor region 13 of the first conductivity type and the semiconductor region 15 of the second conductivity type are arranged so as to contact each other, and form the photoelectric converter PEC. The semiconductor region 15 of the second conductivity type functions as a charge accumulation region where charges serving as majority carriers of the second conductivity type out of negative charges (electrons) and positive charges (holes) generated by photoelectric conversion are accumulated. The semiconductor region 16 of the second conductivity type functions as a floating diffusion (FD) to which the charges are transferred from the semiconductor region 15 serving as the charge accumulation region. A gate electrode 14 is arranged on a gate insulating film (not shown) on the semiconductor substrate 11. A channel is formed between the semiconductor region 15 and the semiconductor region 16 by applying a predetermined voltage to the gate electrode 14. The charges are transferred from the semiconductor region 15 to the semiconductor region 16 via this channel. The semiconductor substrate 11 can be a substrate where, for example, a semiconductor region of the first conductivity type having a higher impurity concentration than that of the semiconductor region 13 of the first conductivity type is arranged so as to contact at least the lower part of the semiconductor region 13.

Although not shown, the photoelectric conversion device 100 can include a peripheral circuit such as a readout circuit. When the photoelectric conversion device 100 is configured as a MOS image sensor, the readout circuit can include, for example, a vertical scanning circuit, a horizontal scanning circuit, and an amplification circuit. When the photoelectric conversion device 100 is configured as a CCD image sensor, the readout circuit can include, for example, a vertical transfer CCD provided for each column and a horizontal transfer CCD which performs horizontal transfer of a signal of each row transferred via the vertical transfer CCD.

As a plurality of interlayer insulating films, a first insulating film 17, a second insulating film 20, a third insulating film 23, and a fourth insulating film 26 are arranged on the semiconductor substrate 11. In addition, on the semiconductor substrate 11, a first electrically conductive pattern 19, a second electrically conductive pattern 22, a third electrically conductive pattern 25, and a fourth electrically conductive pattern 28 are arranged so as to form a plurality of electrically conductive layers, that is, a plurality of wiring layers. The first electrically conductive pattern 19 is arranged on the first insulating film 17. The second electrically conductive pattern 22 is arranged on the second insulating film 20. The third electrically conductive pattern 25 is arranged on the third insulating film 23. The fourth electrically conductive pattern 28 is arranged on the fourth insulating film 26.

The second insulating film 20 is arranged so as to cover the first electrically conductive pattern 19 and the first insulating film 17. The third insulating film 23 is arranged so as to cover the second electrically conductive pattern 22 and the second insulating film 20. The fourth insulating film 26 is arranged so as to cover the third electrically conductive pattern 25 and the third insulating film 23. Furthermore, a protective film 29 is arranged so as to cover the fourth electrically conductive pattern 28. In this example, the fourth electrically conductive pattern 28 is the uppermost electrically conductive pattern and includes a bounding pad. An opening 30 for the bonding pad can be provided in the protective film 29.

The second insulating film 20, the third insulating film 23, and/or the fourth insulating film 26 corresponds to an "insulating film" described in the appended claims. The first electrically conductive pattern 19, the second electrically conductive pattern 22, and/or the third electrically conductive pattern 25 corresponds to an "electrically conductive pattern" described in the appended claims. The second insulating film 20, the third insulating film 23, and the fourth insulating film 26 are films which contain hydrogen. The protective film 29 has lower hydrogen permeability than the second insulating film 20, the third insulating film 23, and the fourth insulating film 26.

A contact hole is provided in the first insulating film 17. A contact plug 18 which connects the semiconductor substrate 11 and the first electrically conductive pattern 19 is formed in the contact hole. A via hole is provided in the second insulating film 20. A via plug 21 which connects the first electrically conductive pattern 19 and the second electrically conductive pattern 22 is formed in the via hole. A via hole is provided in the third insulating film 23. A via plug 24 which connects the second electrically conductive pattern 22 and the third electrically conductive pattern 25 is formed in the via hole. A via hole is provided in the fourth insulating film 26. A via plug 27 which connects the third electrically conductive pattern 25 and the fourth electrically conductive pattern 28 is formed in the via hole.

The number of layers of the electrically conductive patterns 19, 22, 25, and 28, that is, the number of wiring layers is not limited to the number of layers in an example shown in FIG. 3, but can be decided arbitrarily. The first insulating film 17 can be made of, for example, BPSG or silicon oxide. Each of the insulating films 20, 23, and 26 can be made of, for example, silicon oxide. The protective film 29 can be made of, for example, silicon nitride. Each of the electrically conductive patterns 19, 22, 25, and 28 can be made of a material which contains aluminum. More specifically, each of the electrically conductive patterns 19, 22, 25, and 28 can include a portion made of aluminum or an aluminum alloy. The electrically conductive patterns 19, 22, 25, and 28 may have a stacked structure containing a barrier metal. The barrier metal can be made of, for example, titanium or a titanium alloy. For example, a planarizing film, a color filter array, and a microlens array can be arranged on the protective film 29.

A distance d between the lower face of the protective film 29 and the upper face of the first electrically conductive pattern 19 closest to the semiconductor substrate 11 out of the plurality of electrically conductive patterns 19, 22, 25, and 28 can be designed to be within a range of, for example, 400 nm to 3,000 nm. Considering the oblique-incidence characteristic of the photoelectric conversion device 100, the distance d is preferably designed to be within a range of 900 nm to 2,300 nm.

A method of manufacturing the photoelectric conversion device 100 according to the first embodiment of the present invention will be described below with reference to FIGS. 1 to 4. In step S501, the first insulating film 17 and the contact plug 18 are formed on the semiconductor substrate 11 where the photoelectric converter PEC and the like are formed, as schematically shown in a section CS10 of FIG. 1. The first insulating film 17 can be made of, for example, BPSG.

Figure 1:
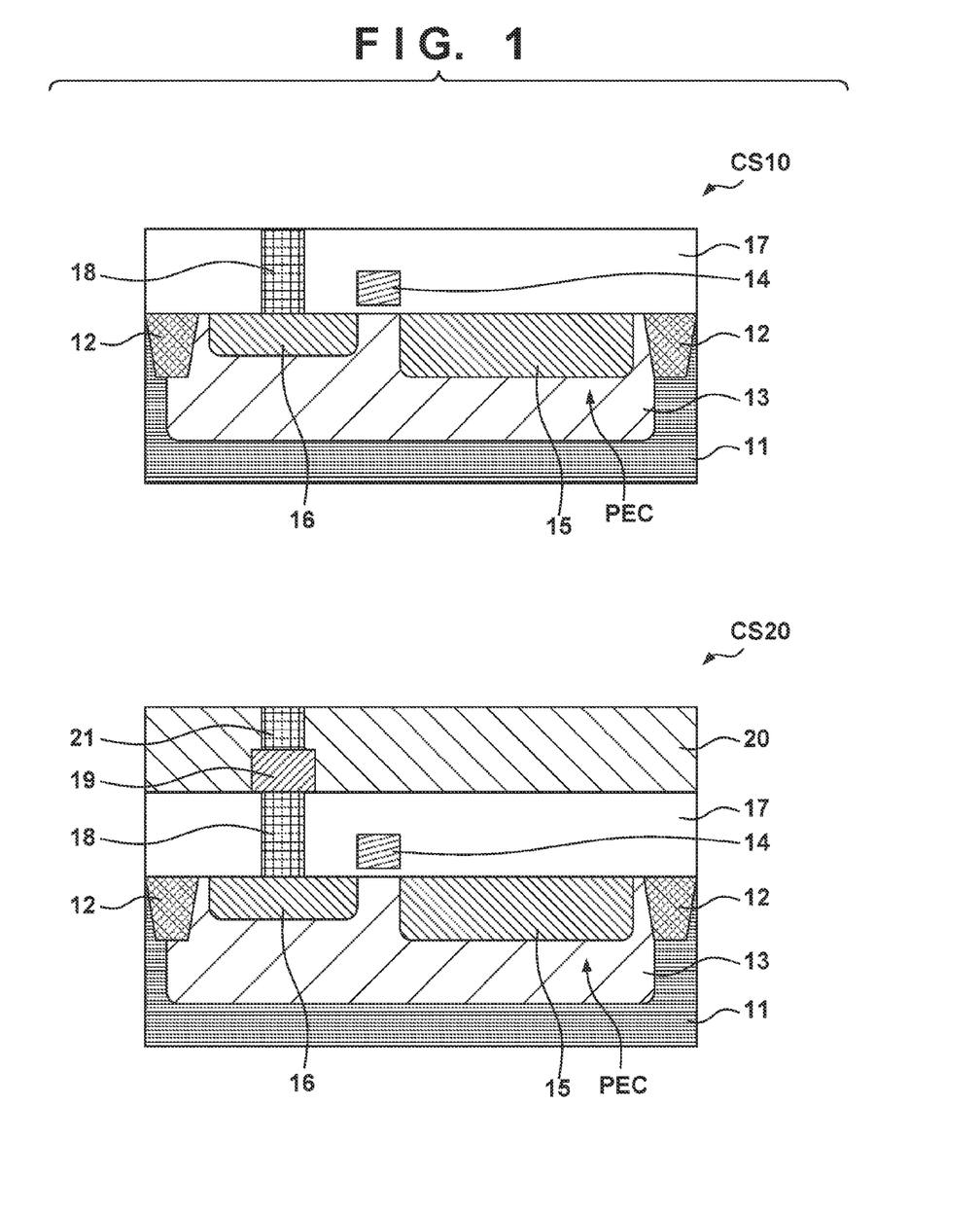
FIG. 1 shows schematic sectional views for explaining a method of manufacturing a photoelectric conversion device according to the first embodiment of the present invention.

Then, in step S502, the first electrically conductive pattern 19 is formed on the first insulating film 17 on the semiconductor substrate 11, as schematically shown in a section CS20 of FIG. 1. The first electrically conductive pattern 19 is made of the material which contains aluminum. In one example, in step S502, an Al film containing 0.5% Cu is deposited by sputtering at 300° C. so as to have a thickness of 230 nm, and then a resist pattern is formed thereon by photolithography. Then, the film is dry etched by using $Cl_2$-based gas with the resist pattern as a mask. This makes it possible to form the first electrically conductive pattern 19 having side faces formed almost vertically. The minimum line width of the first electrically conductive pattern 19 can be, for example, about 0.15 to 0.25 μm.

The first electrically conductive pattern 19 can have, for example, a stacked structure of layers made of TiN/Ti/AlCu/TiN/Ti or a stacked structure of the layers made of TiN/Ti/AlCu/TiN without a Ti layer. The first electrically conductive pattern 19 may have another stacked structure. Each of TiN and Ti functions as a barrier metal. While a stress is reduced by the Ti layer and occurrence of a lost part in the first electrically conductive pattern 19 is suppressed more effectively, a hydrogen sinter effect may be decreased due to a hydrogen storage effect of Ti. In one example, the thickness of TiN is 10 to 50 nm and the thickness of Ti is 0.1 to 10 nm. In order to improve reliability of an electrically conductive pattern made of an AlCu layer, the orientation of the TiN layer under the AlCu layer may be enhanced in a <111> direction so as to enhance the orientation of the AlCu layer in the <111> direction.

Then, in step S503, the second insulating film 20 is formed on the first electrically conductive pattern 19, as schematically shown in the section CS20 of FIG. 1. The second insulating film 20 is an insulating film which contains hydrogen. For example, the second insulating film 20 can be a film formed by a plasma-enhanced chemical vapor deposition method, and more specifically, a silicon oxide film formed by the plasma-enhanced chemical vapor deposition method. In one example, as the second insulating film 20, a 500-nm thick silicon oxide film can be formed by the plasma-enhanced chemical vapor deposition method using a gas containing $SiH_4$ and $O_2$ at a deposition temperature falling within a range of 300° C. to 400° C. If the deposition temperature of the second insulating film 20 falls within a range of 330° C. to 350° C., occurrence of the lost part in the first electrically conductive pattern 19 is suppressed more effectively without losing breakdown voltage performance of the second insulating film 20.

Then, the via hole is formed in the second insulating film 20 and the via plug 21 is formed in the via hole. The via plug 21 can be formed by, for example, forming, using a sputter device or a chemical vapor deposition device, a TiN/Ti film in the second insulating film 20 where the via hole has been formed, and then filling it with W using a plasma-enhanced chemical vapor deposition device.

Figure 2:
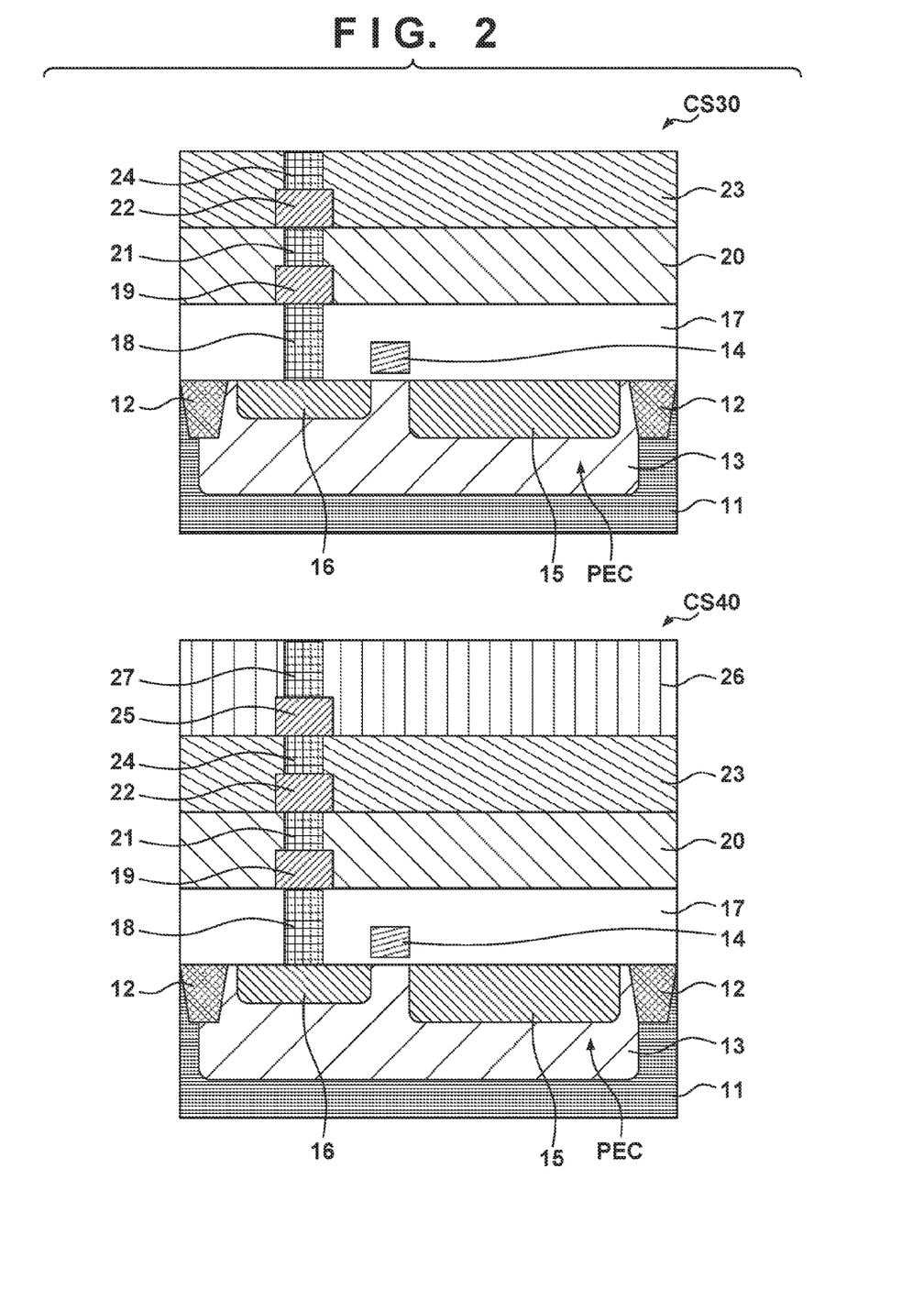
FIG. 2 shows schematic sectional views for explaining the method of manufacturing the photoelectric conversion device according to the first embodiment of the present invention.

Then, in step S504, the second electrically conductive pattern 22 is formed on the second insulating film 20, as schematically shown in a section CS30 of FIG. 2. Like the first electrically conductive pattern 19, the second electrically conductive pattern 22 is made of the material which contains aluminum. In one example, in step S504, an Al film containing 0.5% Cu is deposited by sputtering at 300° C. so as to have a thickness of 230 nm, and then a resist pattern is formed thereon by photolithography. Then, the film is dry etched by using $Cl_2$-based gas with the resist pattern as a mask. This makes it possible to form the second electrically conductive pattern 22 having side faces formed almost vertically. The minimum line width of the second electrically conductive pattern 22 can be, for example, about 0.15 to 0.2 μm. The second electrically conductive pattern 22 can be formed to have the same structure (layer structure) as the first electrically conductive pattern 19.

In step S505, the third insulating film 23 is formed on the second electrically conductive pattern 22, as schematically shown in the section CS30 of FIG. 2. The third insulating film 23 is an insulating film which contains hydrogen. The third insulating film 23 can be formed on the same conditions as the second insulating film 20. If a deposition temperature of the third insulating film 23 falls within a range of 330° C. to 350° C., occurrence of lost parts in the first electrically conductive pattern 19 and the second electrically conductive pattern 22 is suppressed more effectively without losing breakdown voltage performance of the third insulating film 23.

Then, the via hole is formed in the third insulating film 23 and the via plug 24 is formed in the via hole. The via plug 24 can be formed by, for example, forming, using the sputter device or the chemical vapor deposition device, a TiN/Ti film in the third insulating film 23 where the via hole has been formed, and then filling it with W using the plasma-enhanced chemical vapor deposition device.

Then, in step S506, the third electrically conductive pattern 25 is formed on the third insulating film 23, as schematically shown in a section CS40 of FIG. 2. Like the first electrically conductive pattern 19 and the second electrically conductive pattern 22, the third electrically conductive pattern 25 is made of the material which contains aluminum. In one example, in step S506, an Al film containing 0.5% Cu is deposited by sputtering at 300° C. so as to have a thickness of 230 nm, and then a resist pattern is formed thereon by photolithography. Then, the film is dry etched by using $Cl_2$-based gas with the resist pattern as a mask. This makes it possible to form the third electrically conductive pattern 25 having side faces formed almost vertically. The minimum line width of the third electrically conductive pattern 25 can be, for example, about 0.25 to 0.3 μm. The third electrically conductive pattern 25 can be formed to have the same structure (layer structure) as the first electrically conductive pattern 19 and the second electrically conductive pattern 22.

Then, in step S507, the fourth insulating film 26 is formed on the third electrically conductive pattern 25, as schematically shown in the section CS40 of FIG. 2. The fourth insulating film 26 is an insulating film which contains hydrogen. The fourth insulating film 26 can be formed on the same conditions as the second insulating film 20 and the third insulating film 23. If a deposition temperature of the fourth insulating film 26 falls within a range of 330° C. to 350° C., occurrence of lost parts in the first electrically conductive pattern 19, the second electrically conductive pattern 22, and the third electrically conductive pattern 25 is suppressed more effectively without losing breakdown voltage performance of the fourth insulating film 26.

Then, the via hole is formed in the fourth insulating film 26 and the via plug 27 is formed in the via hole. The via plug 27 can be formed by, for example, forming, using the sputter device or the chemical vapor deposition device, a TiN/Ti film in the fourth insulating film 26 where the via hole has been formed, and then filling it with W using the plasma-enhanced chemical vapor deposition device.

Then, in step S508, the fourth electrically conductive pattern 28 is formed on the fourth insulating film 26, as schematically shown in FIG. 3. Like the first electrically conductive pattern 19, the second electrically conductive pattern 22, and the third electrically conductive pattern 25, the fourth electrically conductive pattern 28 is made of the material which contains aluminum. In one example, in step S508, an Al film containing 0.5% Cu is deposited by sputtering at 300° C. so as to have a thickness of 600 nm, and then a resist pattern is formed thereon by photolithography. Then, the film is dry etched by using $Cl_2$-based gas with the resist pattern as a mask. This makes it possible to form the fourth electrically conductive pattern 28 having side faces formed almost vertically. The minimum line width of the fourth electrically conductive pattern 28 can be, for example, about 0. 5 to 1.0 µm. The fourth electrically conductive pattern 28 can be formed to have the same structure (layer structure) as the first electrically conductive pattern 19, the second electrically conductive pattern 22, and the third electrically conductive pattern 25.

Figure 4:
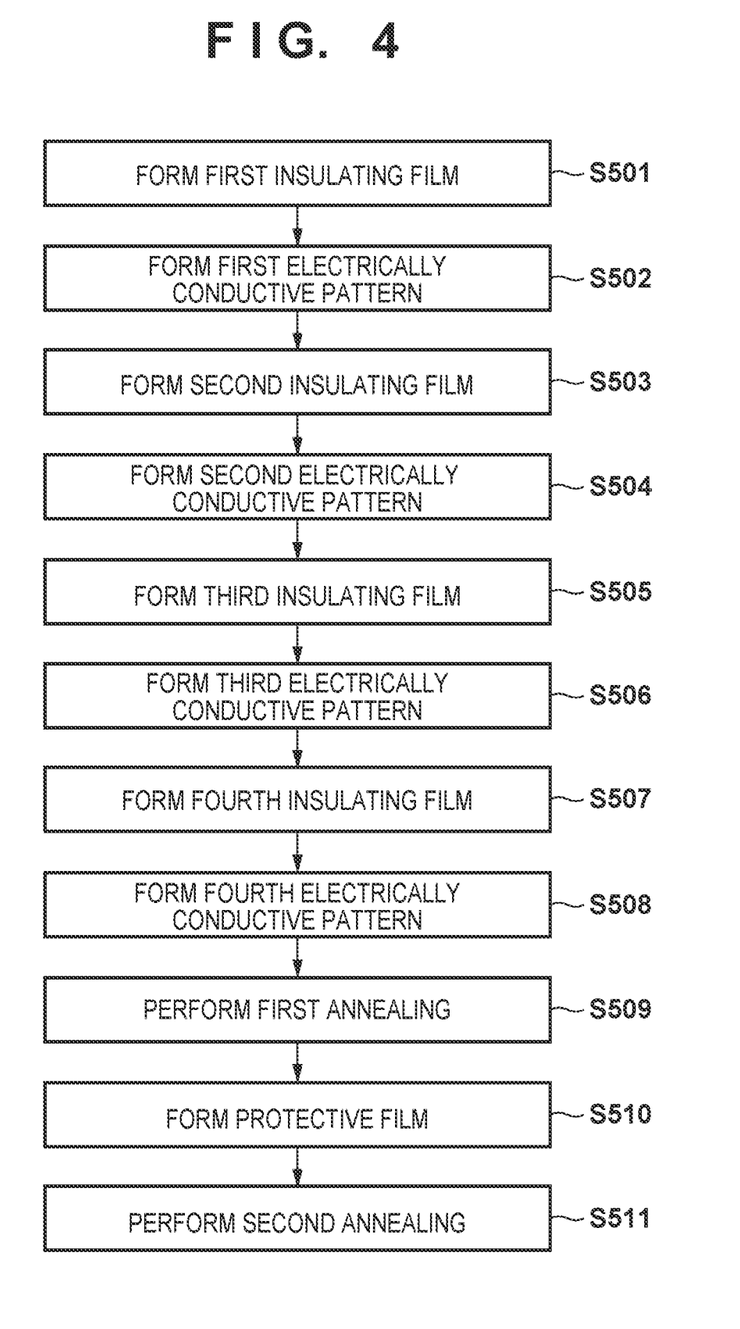
FIG. 4 is a flowchart showing the method of manufacturing the photoelectric conversion device according to the first embodiment of the present invention.

Then, in step S509, the first annealing is performed, in the hydrogen-containing atmosphere, on a structure including the semiconductor substrate 11, the insulating films 17, 20, 23, and 26, the electrically conductive patterns 19, 22, 25, and 28, and the like. The first annealing can be performed on conditions that, for example, a temperature is 400° C., an atmosphere is 50%$H_2$ and 50%$N_2$, and a processing time falls within a range of 10 to 60 min (for example, 30 min). The first annealing makes it possible to reduce an internal stress applied to the electrically conductive patterns 19, 22, 25, and 28. The first annealing also makes it possible to terminate a dangling bond on the surface of the semiconductor substrate 11 by hydrogen and to reduce a dark output. The flow ratio of hydrogen in the first annealing is not limited to 50% but can be set appropriately.

The temperature in the first annealing (step S509) can be, for example, equal to or more than the temperature when forming the second insulating film 20 (the deposition temperature of the second insulating film 20) and equal to less than the temperature when forming the subsequent protective film 29 (a deposition temperature of the protective film 29). This makes it possible to reduce formation of the lost parts in the electrically conductive patterns 19, 22, 25, and 28 while reducing a dark output of the photoelectric conversion device 100.

The first annealing (step S509) may be executed after formation of the fourth insulating film 26 and before formation of the fourth electrically conductive pattern 28.

Then, in step S510, the protective film 29 is formed on the fourth electrically conductive pattern 28, as schematically shown in FIG. 3. The protective film 29 has lower hydrogen permeability than the second insulating film 20, the third insulating film 23, and the fourth insulating film 26. For example, the protective film 29 can be a film formed by the plasma-enhanced chemical vapor deposition method, and more specifically, a silicon nitride film formed by the plasma-enhanced chemical vapor deposition method. In one example, as the protective film 29, a 500-nm thick silicon nitride film can be formed by the plasma-enhanced chemical vapor deposition method using a gas containing $SiH_4$, $N_2$, and $NH_3$ at a deposition temperature falling within a range of 400° C. to 430° C.

As described above, the temperature in the first annealing (step S509) can be, for example, equal to or more than the temperature when forming the second insulating film 20 (the deposition temperature of the second insulating film 20) and equal to less than the temperature when forming the protective film 29 (the deposition temperature of the protective film 29). This makes it possible to reduce formation of the lost parts in the electrically conductive patterns 19, 22, 25, and 28 while reducing the dark output of the photoelectric conversion device 100. Note that the temperature in the first annealing (step S509) is preferably lower than the deposition temperature of the protective film 29 by 10° C. or more. This makes it possible to effectively suppress hydrogen separation from the insulating films 20, 23, and 26 before forming the protective film 29. The protective film 29 suffices to have a protective function of preventing water penetration from outside to the semiconductor substrate 11 and may have, for example, a stacked structure of layers made of SiON/SiN/SiON.

Then, as schematically shown in FIG. 3, a resist pattern is formed on the protective film 29, the protective film 29 is dry etched with the resist pattern as a mask, and then the opening 30 can be formed.

Then, in step S511, the second annealing is performed, in the hydrogen-containing atmosphere, on a structure including the semiconductor substrate 11, the insulating films 17, 20, 23, and 26, the electrically conductive patterns 19, 22, 25, and 28, the protective film 29, and the like. The second annealing can be performed on conditions that, for example, a temperature is 400° C. or more, an atmosphere is 50% to 100%$H_2/N_2$, and a processing time is 30 min or more. The protective film 29 has lower hydrogen permeability than the second insulating film 20, the third insulating film 23, and the fourth insulating film 26. Therefore, outer diffusion of hydrogen is suppressed in the second annealing. Consequently, a process of terminating the dangling bond on the surface of the semiconductor substrate 11 by hydrogen is performed effectively. This is advantageous in reducing the dark output.

As described above, it is possible, by setting the temperature in the first annealing to be equal to or more than the deposition temperature of the second insulating film 20 and to be equal to or less than the deposition temperature of the protective film 29, to reduce formation of the lost parts in the electrically conductive patterns 19, 22, 25, and 28 while reducing the dark output of the photoelectric conversion device 100.

In order to suppress occurrence of the lost parts in the electrically conductive patterns containing aluminum, there is known a method of weakening an Al<111> orientation. However, reliability may be decreased by weakening the Al<111> orientation. On the other hand, according to the first embodiment, occurrence of the lost parts can be suppressed even if the Al orientation is enhanced.

In a preferable example, a decision can be made such that the insulating films 20, 23, and 26 are deposited at a deposition temperature T1 falling within a range of 300° C. to 400° C., the protective film 29 is deposited at a deposition temperature T2 falling within a range of 400° C. to 430° C., and a temperature T3 in the first annealing satisfies $T1 \leq T3 \leq T2$. This implements a reduction in the dark output and a reduction in occurrence of the lost parts in the electrically conductive patterns.

Figure 5A:
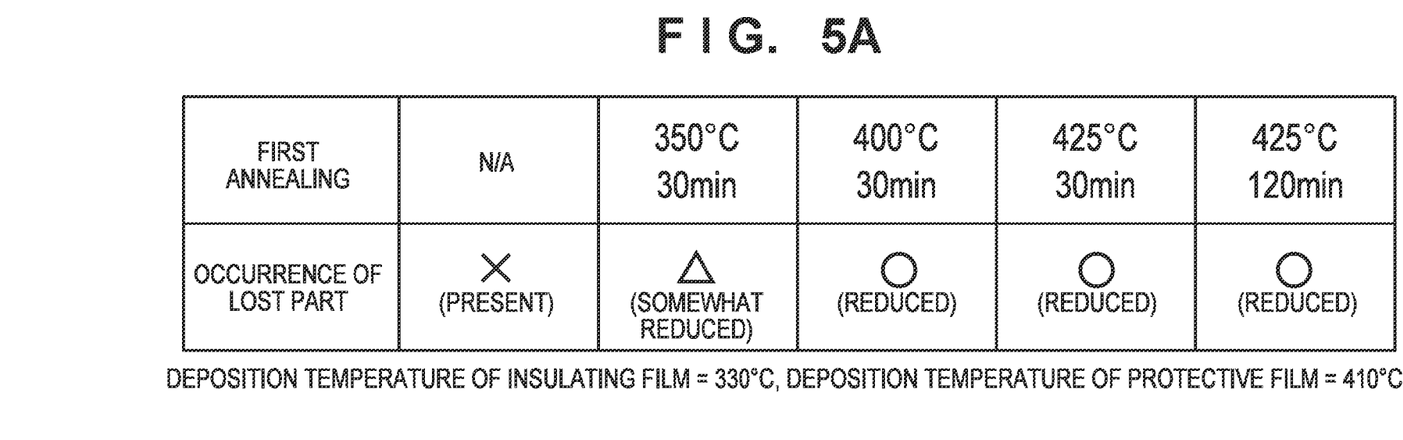
FIG. 5A is a table showing the relationship between temperatures of the first annealing and occurrence of lost parts.
Figure 5B:
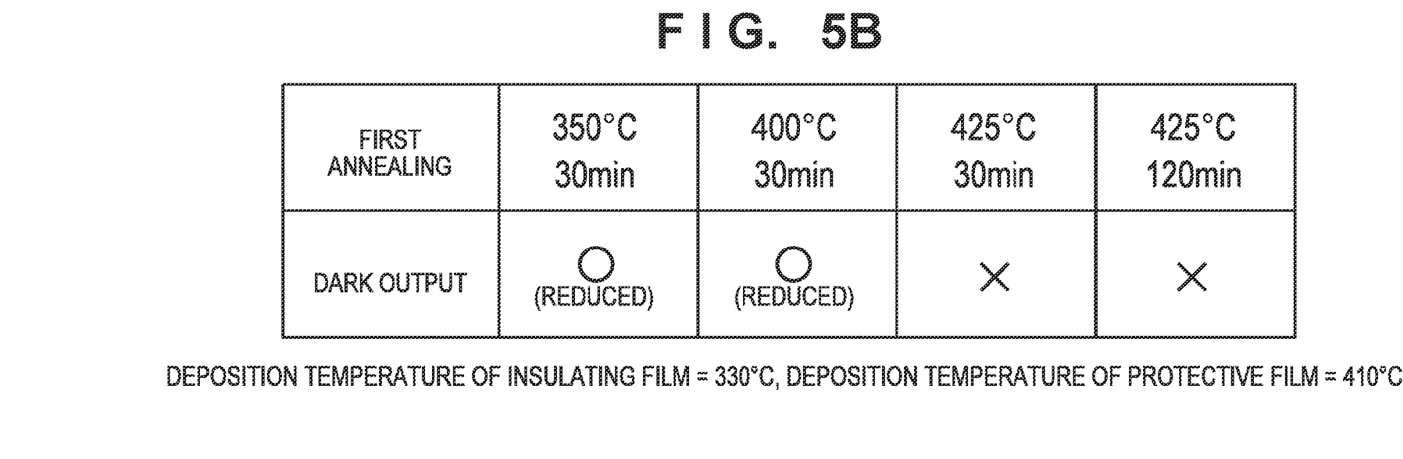
FIG. 5B is a table showing the relationship between the temperatures of the first annealing and a dark output.

FIG. 5A shows a representative result of an experiment on the relationship between the temperatures in the first annealing (step S509) and occurrence of the lost parts in the electrically conductive patterns 19, 22, 25, and 28. FIG. 5B shows a representative result of an experiment on the relationship between the temperatures in the first annealing (step S509) and the dark output in the photoelectric conversion device 100. In those experiments, the silicon oxide films serving as the insulating films 20, 23, and 26 were formed at a deposition temperature of 330° C., and the silicon nitride film serving as the protective film 29 was formed at a deposition temperature of 410° C.

When the temperature in the first annealing (step S509) was 425° C. or more, the dark output was not reduced. This is because if the temperature in the first annealing (step S509) is set high, outer diffusion of hydrogen increases and an effect of terminating the dangling bond by hydrogen is decreased.

Figure 6:
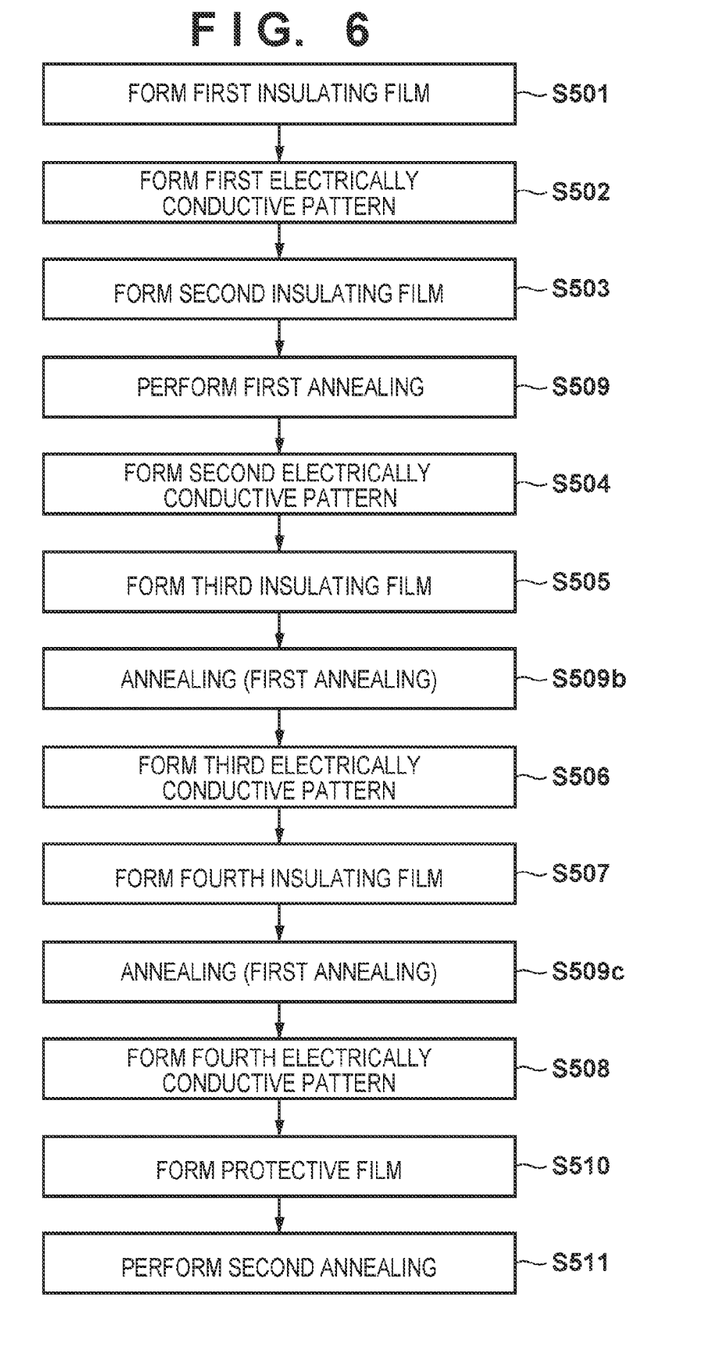
FIG. 6 is a flowchart showing a method of manufacturing a photoelectric conversion device according to the second embodiment of the present invention.

A method of manufacturing a photoelectric conversion device 100 according to the second embodiment of the present invention will be described below. Matters that are not mentioned in the second embodiment can comply with the first embodiment. FIG. 6 shows the method of manufacturing the photoelectric conversion device 100 according to the second embodiment.

In the second embodiment, the first annealing (step S509) is executed after formation (step S503) of a second insulating film 20 and before formation (step S510) of a protective film 29. In the second embodiment, at least one stacking process to be described below is executed after the first annealing (step S509) and before the formation (step S510) of the protective film 29. One stacking process includes a step (step S504) of forming a second electrically conductive pattern 22 which serves as an additional electrically conductive pattern and a step of forming a third electrically conductive pattern 25 which serves as an additional insulating film covering the second electrically conductive pattern 22. Another stacking process includes the step of forming the third electrically conductive pattern 25 which serves as the additional electrically conductive pattern and a step of forming a fourth insulating film 26 which serves as an additional insulating film covering the third electrically conductive pattern 25. In the second embodiment, annealing (steps S509b and S509c) is executed in a hydrogen-containing atmosphere each time the stacking processes are executed.

The annealing (step S509b) can be executed after formation (step S505) of a third insulating film 23 and before formation (step S506) of the third electrically conductive pattern 25. Alternatively, the annealing (step S509b) may be executed after the formation (step S506) of the third electrically conductive pattern 25 and before formation (step S507) of the fourth insulating film 26. The annealing (step S509c) can be executed after the formation (step S507) of the fourth insulating film 26 and before formation (step S508) of a fourth electrically conductive pattern 28. Alternatively, the annealing (step S509c) may be executed after the formation (step S508) of the fourth electrically conductive pattern 28 and before the formation (step S510) of the protective film 29. A stress applied to the insulating films 20, 23, and 26 and a semiconductor substrate 11 can be reduced by the first annealing (step S509) and the annealing (steps S509b and S509c).

The first annealing (step S509) and the annealing (steps S509b and S509c) can be performed on conditions that, for example, a temperature is 400° C., an atmosphere is 50%$H_2$ and 50%$N_2$, and a processing time falls within a range of 10 to 60 min (for example, 30 min). Temperatures in the first annealing (step S509) and the annealing (steps S509b and S509c) can be, for example, equal to or more than deposition temperatures of the insulating films 20, 23, and 26 and equal to or less than a deposition temperature of the protective film 29. This makes it possible to reduce formation of lost parts in an electrically conductive pattern 19 and the electrically conductive patterns 22, 25, and 28 while reducing the dark output of the photoelectric conversion device 100.

In steps S502, S504, S506, and S508, the electrically conductive patterns 19, 22, 25, and 28 are formed by, for example, sputtering. Each of them can have a thickness of, for example, 200 nm or less. Performing the annealing (steps S509, S509b, and S509c) in the hydrogen-containing atmosphere each time the insulating films 20, 23, and 26 are formed is advantageous in reducing occurrence of the lost parts even if the electrically conductive patterns 19, 22, 25, and 28 are made thinner.

Figure 7:
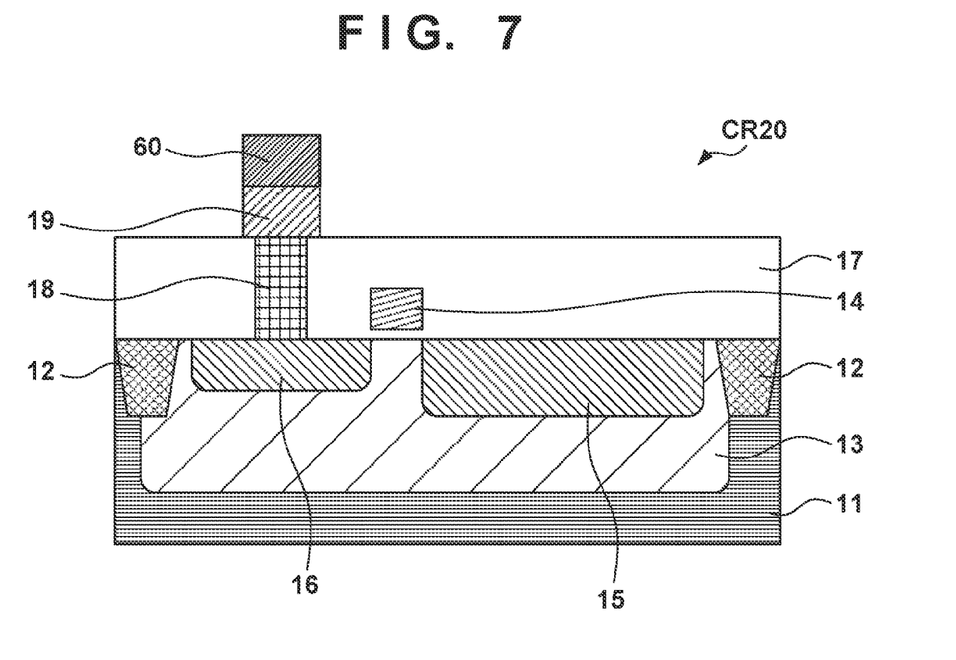
FIG. 7 is a schematic sectional view for explaining a method of manufacturing a photoelectric conversion device according to the third embodiment of the present invention.

A method of manufacturing a photoelectric conversion device 100 according to the third embodiment of the present invention will be described below with reference to FIG. 7. Matters that are not mentioned in the third embodiment can comply with the first embodiment. In the third embodiment, a hard mask is used as an etching mask for patterning an electrically conductive layer in at least some of formation steps of a plurality of electrically conductive patterns. For example, the hard mask can be used to form a first electrically conductive pattern 19 and a second electrically conductive pattern 22. Use of the hard mask is advantageous in, for example, forming an electrically conductive pattern having the minimum line width of about 0.10 to 0.20 μm.

A method of forming the first electrically conductive pattern 19 will exemplarily be described with reference to FIG. 7. First, an Al film containing 0.5% Cu is deposited by sputtering at 300° C. so as to have a thickness of 230 nm. Then, on the Al film, a silicon oxide film is grown so as to have a thickness of 100 to 200 nm through a plasma reaction between TEOS ($Si(OC_2H_5)_4$) and $O_2$ at 300° C. to 400° C. by plasma-enhanced chemical vapor deposition. Then, a resist pattern is formed by photolithography. Then, the silicon oxide film is dry etched by using $CF_4$-based gas and a hard mask 60 made of the silicon oxide film is formed. Then, the hard mask 60 is used as an etching mask and the Al film is dry etched by using $Cl_2$-based gas, thereby patterning the Al film. Consequently, the first electrically conductive pattern 19 having side faces formed almost vertically is formed. The minimum line width of the first electrically conductive pattern 19 can be, for example, about 0.10 to 0.20 μm. The second electrically conductive pattern 22 can also be formed in the same manner as the first electrically conductive pattern 19. The minimum line width of the second electrically conductive pattern 22 can be, for example, about 0.10 to 0.20 μm.

Use of the hard mask 60 is also advantageous in, for example, suppressing occurrence of lost parts in the electrically conductive patterns in formation of the electrically conductive patterns each having the minimum line width of 0.10 to 0.20 μm.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-095228, filed May 7, 2015, which is hereby incorporated by reference herein in its entirety.

What is claimed is:

1. A method of manufacturing a photoelectric conversion device, the method comprising:
    forming, with a material which contains aluminum, an electrically conductive pattern on a semiconductor substrate including a photoelectric converter;
    forming, on the electrically conductive pattern, an insulating film which contains hydrogen;
    performing, in a hydrogen-containing atmosphere, first annealing on a structure including the semiconductor substrate, the electrically conductive pattern, and the insulating film;
    forming, on the insulating film, a protective film having lower hydrogen permeability than that of the insulating film after the first annealing; and performing, in the hydrogen-containing atmosphere, second annealing on a structure including the semiconductor substrate, the electrically conductive pattern, the insulating film, and the protective film after formation of the protective film, wherein a temperature in the first annealing is not less than a temperature when forming the insulating film and not more than a temperature when forming the protective film.

2. The method according to claim 1, wherein the insulating film is formed by a plasma-enhanced chemical vapor deposition method.

3. The method according to claim 1, wherein the insulating film is a silicon oxide film.

4. The method according to claim 1, wherein the protective film is formed by a plasma-enhanced chemical vapor deposition method.

5. The method according to claim 1, wherein the protective film is a silicon nitride film.

6. The method according to claim 1, wherein at least one stacking process is included after the first annealing and before formation of the protective film, and the stacking process includes forming an additional electrically conductive pattern and an additional insulating film which covers the additional electrically conductive pattern, annealing is executed in the hydrogen-containing atmosphere each time the stacking process is executed, and a temperature in the annealing is not less than a temperature when forming the insulating film and the additional insulating film, and not more than a temperature when forming the protective film.

7. The method according to claim 1, wherein the forming the electrically conductive pattern includes forming a hard mask after forming a film with a material which contains aluminum and patterning the film by using the hard mask.

8. The method according to claim 1, wherein on the semiconductor substrate, a plurality of electrically conductive patterns including the electrically conductive pattern are arranged so as to form a plurality of wiring layers, and a distance between a lower face of the protective film and an upper face of the electrically conductive pattern closest to the semiconductor substrate out of the plurality of electrically conductive patterns falls within a range of 400 to 3,000 nm.

* * * * *